United States Patent [19]
Mifsud et al.

[11] Patent Number: 6,081,910
[45] Date of Patent: Jun. 27, 2000

[54] CIRCUIT FOR ALLOWING A TWO-PASS FUSE BLOW TO MEMORY CHIPS COMBINING AN ARRAY BUILT-IN SELF-TEST WITH REDUNDANCY CAPABILITIES

[75] Inventors: Jean-Paul Mifsud, Lieusaint, France; Stuart Rapoport, Washington, D.C.

[73] Assignee: International Business Machines Corporation, Armonk, N.Y.

[21] Appl. No.: 08/222,784

[22] Filed: Apr. 4, 1994

[30] Foreign Application Priority Data

Jun. 30, 1993 [EP] European Pat. Off. ............ 93480082

[51] Int. Cl.[7] .................................................. G11C 29/00
[52] U.S. Cl. ...................... 714/718; 714/719; 714/720; 714/724; 714/725; 714/819
[58] Field of Search ................................. 714/718, 719, 714/720, 724, 725, 819; 365/201

[56] References Cited

U.S. PATENT DOCUMENTS

| | | | |
|---|---|---|---|
| 4,833,652 | 5/1989 | Osobe et al. ........................... | 365/201 |
| 5,021,944 | 6/1991 | Sasaki et al. ........................... | 365/200 |
| 5,173,906 | 12/1992 | Dreibelbis et al. ..................... | 371/22.5 |
| 5,299,164 | 3/1994 | Takeuchi et al. ....................... | 365/201 |

FOREIGN PATENT DOCUMENTS 0 140 595  10/1984  European Pat. Off. .

OTHER PUBLICATIONS

"Dynamic Self–Repair Redundancy System" IBM Technical Disclosure Bulletin, vol. 34, H. 5, pp. 448–449, Oct. 1991.

*Primary Examiner*—Hoa T. Nguyen
*Attorney, Agent, or Firm*—H. Daniel Schurmann

[57] ABSTRACT

A circuit that enhances the testability of an integrated circuit of a memory type and which identifies defective redundant word lines in a state of the art SRAM macro that combines an ABIST structure with a redundancy mechanism. The circuit allows a two-pass fuse blow after completing the burn-in process that significantly increases the manufacturing yield and repairability of the SRAM macro.

9 Claims, 4 Drawing Sheets

CIRCUIT FOR ALLOWING A TWO-PASS FUSE BLOW TO MEMORY CHIPS COMBINING AN ARRAY BUILT-IN SELF-TEST WITH REDUNDANCY CAPABILITIES

FIELD OF THE INVENTION

The present invention relates to the test of integrated circuits of the memory type that combines built-in self-test with redundancy capabilities. It more particularly relates to a circuit that identifies defective word lines in a memory redundant array. As a result, a second pass of fuse blow after burn-in is allowed, thereby significantly improving the repairability of the integrated circuits.

BACKGROUND OF THE INVENTION

As memories grow faster, denser, and more complex, there is an increased demand for ABIST (Array Built-In Self-Test) structures for logic and memory fault detection offering high speed and high test coverage, while at the same time, consuming minimal area of a semiconductor chip. In addition, it is also highly desired to have a redundancy mechanism (word or bit line) to be combined therewith for repairability purposes. The combination of these two features will become more prevalent in the near future due to reasons that include testing cost, time and yield improvement. By way of example, to date, in conventional SRAM macros implementing these combined features, the replacement of defective lines with redundant lines is performed on product chips at the wafer level before burn-in and is limited to a single pass of fuse blow, as it will be explained herewith in conjunction with FIGS. 1 to 3.

FIG. 1 shows the block diagram architecture of a prior art SRAM macro 10 provided with an ABIST unit 11. A similar architecture is described in U.S. Pat. No. 5,173,906 of common assignee. The functional units shown in FIG. 1, either form part of a stand-alone SRAM or the SRAM macro of a logic array of an integrated circuit chip. In the latter case, the chip may include a plurality of such macros, each provided with its own dedicated ABIST unit. The integrated circuit chip described is part of a wafer fabricated in a very large scale integration (VLSI) semiconductor technology and is presumed to be designed according to level-sensitive scan design (LSSD) rules.

As known to those skilled in the art, the SRAM macro 10 shown in FIG. 1 has three basic modes of operation: A SYSTEM mode, in which the SRAM macro 10 operates normally, i.e., where the memory unit 12 is either read or written, using the data-in signals DATAIN1 to DATAINM, the SRAM address signals ADDIN1 to ADDINP, and the read/write control signal R/WIN (where in M and P are, respectively the bit widths of the data-in bus DATAIN and the SRAM address bus ADDIN). A second mode is required to satisfy LSSD requirements: the SCAN mode which is used for initializing/analyzing (SCAN-IN/SCAN-OUT) all the data of the latch pairs forming an LSSD chain. Finally, a third mode, the ABIST mode, in which the functionality of memory unit 12 is tested. It is a self-test which is first performed in a manufacturing environment before the chip is commercially released. A slightly different, more relaxed self-test is performed while the chip is incorporated in a system, for example, at the customer location, and thus in a system environment. As a result, the ABIST mode is used in a different environment referred to hereinafter as the ABIST manufacturing sub-mode and the ABIST system sub-mode.

In the ABIST mode, according to the fundamentals of the self-test technique, the ABIST unit 11 generates a plurality of test patterns. Each test pattern consists of a set of deterministic 0's and 1's that are first written into memory 12, read out and compared with an expected pattern. The test pattern sequences play a key role in exercising the memory unit 12 to verify if the memory unit 12 under test is functioning properly, i.e., to determine whether the READ and WRITE operations were successfully executed. To that end, the ABIST unit 11 generates self-test data signals STDATA, self-test address signals STADD, and the self-test read/write control signal STRW.

Three groups of multiplexers select the signals to be fed to the memory unit 12. They include either the external signals mentioned above which are generated outside the SRAM macro 10, namely, DATAIN1 . . . DATAINM, ADDIN1 . . . ADDINP, and R/WIN or, alternatively, internal self-test signals generated by the ABIST unit 11 previously mentioned, namely, the STDATA, STADD, and STRW signals. The multiplexers forming these three groups are respectively referenced as 13-1 to 13-M, 13'-1 to 13'-P, and 13". The selection is made by the ABIST control signal. Normally, external signals are selected when the ABIST signal is held at a logic "0", whereas when signals internally generated by the ABIST unit 11 are selected, it is held at a logic "1". The ABIST signal thus allows SRAM 10 to operate either in a SYSTEM mode or in an ABIST mode. The three groups of multiplexers, i.e., 13-1 to 13-M, 13'-1 to 13'-P, and 13" form multiplexer block 13. The outputs of the first and second groups are labelled DATA bus and ADD bus, with M and P as their respective bit widths. The output of multiplexer 13" is a single line that transports the R/W control signal that determines the READ/WRITE operating mode of memory 12.

The data-out signals that are outputted by memory 12 are stored in a plurality of data-out L1/L2 pairs of latches (14-1 to 14-M) forming the data-out shift register 14. Generally, these data-out latch pairs are incorporated into the memory 12. The data-out signals that are outputted by the L1 and L2 latch pairs are labelled DATAOUT1 to DATAOUTM (DATAOUT bus), and DOUT1 to DOUTM (DOUT bus), respectively.

In the ABIST mode, after performing a READ operation, expected data signals (EXDATA) are generated by ABIST 11 on the EXDATA bus and are compared in the data compression 15 via data-out signals DOUT1 to DOUTM. Typically, only four test patterns are used in each word of memory 12: alternating 0's and 1's, i.e., 0101 . . . 01 and 1010 . . . 10, all 0's and all 1's. Alternatively, there are only four self-test data signals, labelled STDATA0, STDATA1 and their respective complements. Because of the particular structure of these four test patterns, the data-out signals DOUT1 to DOUTM are divided into even and odd data-out signals. The even data-out signals that are outputted from the data-out shift register unit 14 are labelled DOUT2, DOUT4, . . . , DOUT2j, and likewise, the odd data-out signals are labelled DOUT1, DOUT3, . . . , DOUT(2j-1), wherein j is an integer equal to M/2, assuming that M is an even number. Since all the even and odd numbered bits of the data-out signals have simultaneously the same '0' or '1' value, only two expected data signals are required, each consisting of a single bit, EXDATA0 and EXDATA1. For instance, assuming that the data-out signals to be read on the DOUT bus are: 010101 . . . 01, the expected data signal EXDATA0 (for the even numbered bits) will be "1"0 and the expected data signal EXDATA1 (for the odd numbered bits) a "0". EXDATA0 and EXDATA1 are thus the expected results of the even and odd data-out signals, respectively. Finally, data compression unit 15 generates a signal labelled RESULT which is held at a "1" if a mismatch occurs during the comparison. By mismatch, it is to be understood that at least one data-out signal does not have the same logic value as its corresponding even or odd expected data generated by the ABIST structure 11. This mismatch is often caused by a defective word line in the memory unit 12 at a predetermined address. This mismatch is usually referred to as a "fail". Alternatively, if all data-out signals match the corresponding even or odd expected data signals (which means no fail is detected), the RESULT signal is held at "0". The RESULT signal, which is often referred to as the FAIL FOUND LAST CYCLE signal, indicates after completing a READ operation, whether the memory unit 12 at the current address is defective. The RESULT signal is thus indicative of the fail/no fail status of memory unit 12 on a cycle by cycle basis.

Another key component of the prior art SRAM macro 10 is the fail register unit 16. It is required because, in the ABIST manufacturing sub-mode, the addresses of the defective word lines have to be identified, then memorized for subsequent use in the SYSTEM mode. When the RESULT signal is raised to a logic "1", indicating the presence of a failure, the word portion of the current address generated by the ABIST unit 11 on the STADD bus, (labelled STADD*), is stored in a bank of pairs or latches of the fail address register 16. This stored word address thus corresponds to the address of a defective word line.

The ABIST unit 11 also generates a CNOOP (NOOP stands for NO OPERATION) signal to inhibit the ABIST self-test mode, when the totality of the test pattern sequences has been fully exercised on the memory unit 12. This signal is required when there is a plurality of SRAM macros embedded in a semiconductor chip. The macros may have different sizes that require varying durations for their respective test. The CNOOP signal generated by the ABIST unit of each SRAM macro allows the memory units of all macros to be simultaneously tested.

Clocking the SRAM macro 10 is achieved using standard procedures in accordance with LSSD rules. In the state of the art architecture of an SRAM, as illustrated in FIG. 1, clocking would normally be implemented by standard external LSSD clock signals labelled A, B, C, S, and CS (CHIP SELECT for a stand-alone SRAM chip or ARRAY SELECT for a SRAM macro). Note that the S clock signal, which is substantially the same as the B clock signal, is applied to the L2 latches of the latch pairs 14-1 to 14-M of the data-out shift register 14. In the ABIST manufacturing sub-mode, the clock and CS signals are derived from the tester. In the ABIST system sub-mode, these signals are derived from the system clock. The SCAN-IN (SI) signal is applied to the ABIST unit 11 according to the standard LSSD rules, as illustrated in FIG. 1. However, for sake of simplicity, the SCAN-OUT signal generated by ABIST 11 in response to the SCAN-IN signal to be applied to the next latch pair, etc., along the whole LSSD chain, is not shown. In the following description, only latches will be referred to, while it is clear that according to LSSD rules, they are in reality latch pairs. All these signals are directly applied to ABIST 11 and/or to the memory 12, except for the C clock and CS signals. The C clock signal is applied to one input of a 2-way AND gate 17A. The CS signal is applied to one input of the 2-way AND gate 17B. The CNOOP signal is applied to the second input of AND gates 17A and 17B as a gating signal in order to block, when needed, the transmission of the respective C clock and CS signal. This occurs when the self-test has been completed in the ABIST mode, and permanently in the SYSTEM mode. The A, B, and S clock signals are used during the SCAN mode, whereas the B, C, S and CS signals are used during the ABIST mode. The CS signal is used alone in the SYSTEM mode while the LSSD clock signals are held in a non-active state. Numeral 18 schematically illustrates the clock distribution scheme in the SRAM macro 10 and also includes the internal chip clock distribution network servicing it. This terminates the description of a state of the art SRAM macro provided with an ABIST structure.

Referring back to FIG. 1 illustrating a state of the art SRAM macro architecture, a typical word line redundancy mechanism will be briefly discussed. Note that a bit line or a block redundancy mechanism could be implemented just as well. For convenience sake, let the memory unit 12 be comprised of three blocks: a memory cell array 12A, a word and bit line decoder 12B and a comparator 12C. Memory cell array 12A is subdivided into a regular or standard array 12A' and a redundant array 12A". Let it be assumed that the redundant array 12A" contains q redundant word lines. The SRAM macro 10 further includes a storage unit 19 that contains non-volatile programmable elements, such as metal or polycristalline fuses. These elements store the addresses of the defective word lines of the regular array 12A' to be replaced by redundant word lines and to be referred hereinafter as the defective word addresses. As apparent from FIG. 1, all the connections between these elements are standard connections.

Compare circuit 12C receives signals through a first bus, referred to as the ADD* bus, which transports the word portion of the address available on the ADD bus, and a second bus which contains all the defective word line addresses, (referred to hereinafter as the DADD bus), from the storage unit 19. In addition to the defective word line addresses, the DADD bus also includes q "flag" lines. Each "flag" line transports a signal that indicates the presence of an active defective word line. As well known to those skilled in the art, the basis of the redundancy mechanism is a comparison function that reroutes addressing of defective word lines of the regular array 12A' towards redundant word lines of the redundant array 12A". At each cycle, the current address is applied to the decoder 12B. Similarly and in parallel, the word portion carried on bus ADD* is compared in comparator 12C with the defective word addresses stored in storage unit 19. This comparison aims at determining whether the current word address corresponds to the address of a defective word line. If found defective, the word line of the regular array 12A' needs replacing by one of the q redundant word lines of the redundant array 12A". This selection is achieved by comparator 12C which activates the appropriate selection signal R1, . . . , Rq. Selection signals R1, . . . , Rq are directed from comparator 12C to the redundant array 12A" via the R1/Rq bus. In addition, a control signal labelled MATCH is also sent to the decoder block 12B to inhibit the latter. This only occurs if a match exists between the current address present on the ADD* bus and one of the addresses present in the DADD bus. The MATCH signal controls the final stage of the word and bit line decoder 12B and inhibits only the word portion thereof.

A second key component of the redundancy mechanism is the fail register unit 16. In the ABIST manufacturing sub-mode, the addresses of the defective word lines once identified, are temporarily stored in said fail address register 16, and then permanently memorized in storage unit 19. These stored defective word addresses will be subsequently and permanently used in the SYSTEM mode. Obviously, there is a one to one correspondence between the addresses stored in the storage unit 19 and in the fail address register unit 16.

The storage process will be explained in more details in conjunction with FIG. 2, which schematically illustrates the circuit implementation of a conventional fail address register unit 16, such as described in U.S. Pat. No. 5,173,906. It is comprised of two blocks 16A and 16B and of an optional third block 16C located in the data compression unit 15. Block 16A includes address load register 21 which receives the STADD* signal bus from the ABIST unit 11, i.e., the word portion of the self-test addresses. The output bus of register 21 is connected in parallel to the input of q fail address registers 22-1 to 22-q. Note that a number of fail address registers different from the number q of redundant word lines could be envisioned as well. The role of the failed address register 22-1 is to store the first defective (failing) word address, followed by the second, etc., until fail address register 22-q stores the qth defective word address. To each of these fail address registers is associated a corresponding "flag" latch (referenced 23-1 to 23-q). The RESULT signal generated by the data compression unit 15 is applied to the input of "flag" latch 23-1, to the input of enabler logic 24, and to one input of (q+1)-way AND gate 25. The role of enabler logic 24, which essentially consists of AND gates, is to store an appropriate logic value in the "flag" latches 23-2 to 23-q so that at any time this logic value is stored in a predetermined "flag" latch, its corresponding fail address register is inhibited, i.e. it is prevented from receiving a new defective word address. This reasoning applies to "flag" latch 23-1 and to register 22-1, except that "flag" latch 23-1 is controlled by the RESULT signal. The outputs of flag latches 23-1 to 23-q are applied to the q remaining inputs of AND gate 25. Block 16A thus essentially consists of a bank of registers to store the defective word addresses. When all inputs of AND gate 25 are raised to a "1", the output signal, labelled COMPOSITE RESULT (CR), is likewise raised to "1", thus indicating that all registers have been filled. In block 16B, the CR signal generated by AND gate 25 is applied to the first input of 2-way OR gate 26 whose output is connected to latch 27. The output of latch 27 is attached to the second input of OR gate 26. This connection forms a self-locking loop, so that when latch 27 is set to a logic "1", its content can no longer be changed. Thus, block 16B is essentially a self-maintained fail register latch 27. Referring to block 16C, the RESULT signal is applied to the first input of 2-way OR gate 28, whose output is connected to latch 29. OR gate 28 and latch 29 are implemented in a similar manner to OR gate 26 and latch 27 of block 16B, as apparent from FIG. 2. Latch 29 is usually referred to as the "fail/no fail" latch.

Operation of the conventional fail address register 16 of FIG. 2 is as follows. During the course of a READ operation in the ABIST mode, the RESULT signal supplied by the data compression unit 15 and the STADD* signals supplied by ABIST unit 11 are used to memorize the defective word line addresses. At each cycle, address load register 21 receives the current word address from STADD*. On the following cycle, its content is presented in parallel to the input of all fail registers 22-1 to 22-q, but it is copied only to those fail address registers whose flag latches have not been locked. Due to the pipeline organization of the ABIST unit 11, register 21 is used to delay the STADD* signals by one cycle with respect to the RESULT signal. At each fail detected by data compression unit 15, the RESULT signal is raised to the "1" logic level and at the first fail, this information is saved in the "fail/no fail" latch 29. OR gate 28 is used in conjunction with "fail/no fail" latch 29 to save this information during the entirety of the ABIST mode, i.e., in either of the two manufacturing and system sub-modes. Simultaneously, the flag latch pair 23-1 is locked to a "1", and this value inhibits its corresponding fail register 22-1, i.e., it prevents any changes by deactivating its LSSD clock signal C. This fault detection process continues under the control of enabler logic 24 until register 22-q is reached. At each cycle, the intermediate results are combined in the AND gate 25 to generate the CR signal. If the number of defective word line addresses exceeds the number of available redundant word lines (or the fuse repair capabilities), on the following cycle, the CR signal is raised to the high level (logic "1"). This information is saved in latch 27, where it is maintained during the totality of the ABIST manufacturing sub-mode (and in the system sub-mode as well, except that in this case, the information is not used). When latch 27 is set to a "1", the memory unit 12 is considered "unfixable", and the product chip must be rejected. Dedicated latch 27 is usually referred to in the literature as a "not fixable" latch.

With the structure shown in of FIGS. 1 and 2, the current test methodology is illustrated by algorithm 30 (FIG. 3). Product chips at the wafer level stocked in box 31 are first tested in box 32, to identify initially good (IG), repairable (R), and bad (B) chips. Bad chips are rejected in box 33. Repairable chips are fixed in box 34 to allow the subsequent use of spare redundant word lines. As explained above by reference to FIG. 2, during the ABIST manufacturing sub-mode, addresses of defective word lines are identified and stored in the registers of fail address register unit 16. Then a SCAN mode is performed, the fail address registers 22-1 to 22-q forming the LSSD chain are unloaded and the addresses transferred to the tester. Finally, the defective word addresses are sent from the tester to a conventional fuse tool to be written in storage unit 19 using conventional laser fuse blow techniques. Each defective word address corresponds to a register in the fail register unit 16 and a row of fuses in storage unit 19. For each row, an additional "flag" fuse is provided which corresponds to the "flag" latch in fail address register unit 16, that indicates whether the defective word line is active. Once these defective word line addresses have been permanently stored in storage unit 19, the repaired chips are tested in box 35 to determine their functionality. Bad chips are rejected in box 33. Repaired good (RG) chips from box 35 and initially good (IG) chips from box 32 are submitted to the burn-in step in block 36 and tested in block 37. Depending on the results of the post burn-in or final test completed in block 37, only finally good (FG) chips are retained for shipment in block 38, while bad (B) chips are rejected from the production lots in box 33.

With the conventional technique described above, only a one-pass fuse blow is possible in the ABIST mode. A second pass fuse blow would not be possible after final test in block 34 because, had a fail been detected, there would be no way to identify its origin: whether in the regular array 12A' or in the redundant array 12A". A defective word line detected by ABIST 11 could possibly be located in redundant array 12A". Indeed, there is no known methodology to adequately test redundant array 12A". An iterative process for repairing the product chip is not possible, because if a defective word line that was already replaced by a redundant word line during the first pass has to be repaired in block 34, two redundant word lines would be mapped on the same word address. This is clearly not acceptable. Even if fuses are available for replacing the defective word line, the chip cannot be repaired and is considered defective, while in actuality, it could be repaired. Another problem is that there is no way to track whether some or all of the redundant addresses have already been used. As a result, ABIST 11 may indicate that the memory unit of a product chip is repairable, when in reality it is not. Presently, chips failing after a single pass laser fuse blow are rejected because it is not possible to determine whether all redundant lines were used. In all cases, the manufacturing yields are severely impacted.

In addition to the methodology of FIG. 3, there is no way of determining if a chip has already been repaired (unless a special marking/handling is performed), because initially good and repaired good chips are sorted and stocked in the same block 38. It is admitted that in the future, in the ABIST system sub-mode, should a fail appear during the lifetime of the chip operating in a system environment, it will be automatically repaired in situ using electrical fuses. (Electrical fuses are those that can be electrically blown, as opposed to conventional fuses that can only be laser blown using a complex laser tool.) It thus could be important in the future to distinguish initially good from repaired good product chips in that regards to allow self-repair during the lifetime of a chip.

All these drawbacks result from the limitation of the prior art technique based on a single pass fuse blow methodology. Consequently, for the reasons given above, it is highly desirable that a second pass fuse blow be made possible at the time the chip is manufactured and during its subsequent system environment. A second pass fuse blow provides not only a significant improvement in manufacturing yields, but also allows self-repair by in-situ reconfiguration of electrical fuses of the chip in a system environment. It, therefore, also improves the in-field serviceability of the system incorporating such chips.

OBJECTS OF THE INVENTION

Therefore, it is a primary object of the present invention to provide a circuit that identifies defective redundant word lines in SRAM macros combining an ABIST structure with a redundancy mechanism, thereby allowing a two-pass fuse blow to improve manufacturing yields.

It is another object of the present invention to provide a circuit that identifies defective redundant word lines in SRAM macros combining an ABIST structure with a redundancy mechanism, thereby allowing a two-pass fuse blow that is extendable to an N-pass fuse blow to improve in-field system serviceability.

SUMMARY OF THE INVENTION

According to the basic principles of the present invention, there is provided a circuit that identifies defective redundant word lines in SRAM macros provided with an ABIST structure and a redundancy mechanism. The circuit generates a signal whose logic value indicates whether a fail has been detected in a selected word line of the redundant array. To that end, the circuit combines existing signals: selection signals R1 to Rq, RESULT and COMPOSITE RESULT signals that are generated in conventional SRAM macros provided with an ABIST structure with a redundancy mechanism. Signals R1 to Rq indicate whether a redundant word line was selected. RESULT indicates, after completing a READ operation, whether the selected word line of the memory unit at the address being tested is defective. The COMPOSITE RESULT signal indicates that the number of fails detected exceeds the number q of redundant word lines. All those signals run in a cycle by cycle mode. The q selection signals R1 to Rq are applied to a q-way OR gate whose output is connected to a latch. The signal outputted by the latch and by RESULT are ANDed. The signal which is generated by the AND gate (indicative that the current redundant word line is defective) is available for further processing. Preferably, this signal and the COMPOSITE RESULT signal are applied as input signals to the first and second inputs of a 3-way OR gate, whose output is connected to the "not fixable" latch. In turn, the output of this latch is connected to the remaining third input of the said 3-way OR gate. If there is a fail on a redundant word line, the "not fixable" latch (which holds the information as to the repairability of the memory unit) is set to indicate a non-repairable condition. The "not fixable" latch indicates not only whether there are more fails than the number that can be fixed, but at the same time, whether a fail has been found in the redundant array of the memory unit. As a result, a two-pass fuse blow process (extendable to a N-pass fuse blow) is now made possible. This second pass fuse blow can be performed either in a manufacturing environment, before or after burn-in, or in a system environment should electrical fuses be available.

BRIEF DESCRIPTION OF THE INVENTION

The features believed to be characteristic of this invention are set forth in the claims. The invention itself, however, as well as other objects and advantages thereof may be best understood by reference to the following de tailed description of an illustrated preferred embodiment to be read in conjunction with the accompanying drawings, in which:

DETAILED DESCRIPTION OF THE INVENTION

Figure 1:
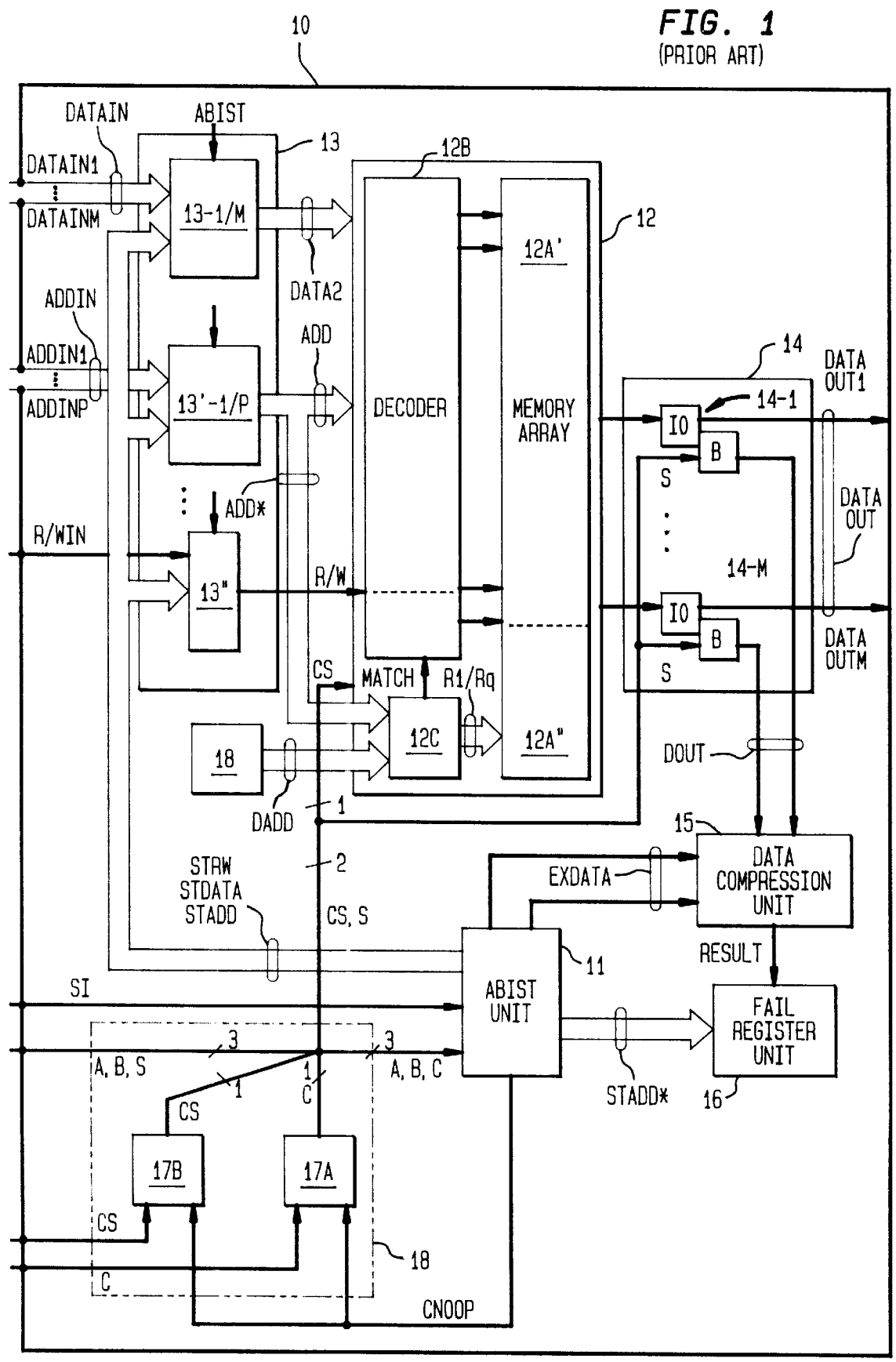
FIG. 1 shows a partial schematic view of the architecture of a prior art SRAM macro including an ABIST unit combined with a redundancy mechanism.
Figure 2:
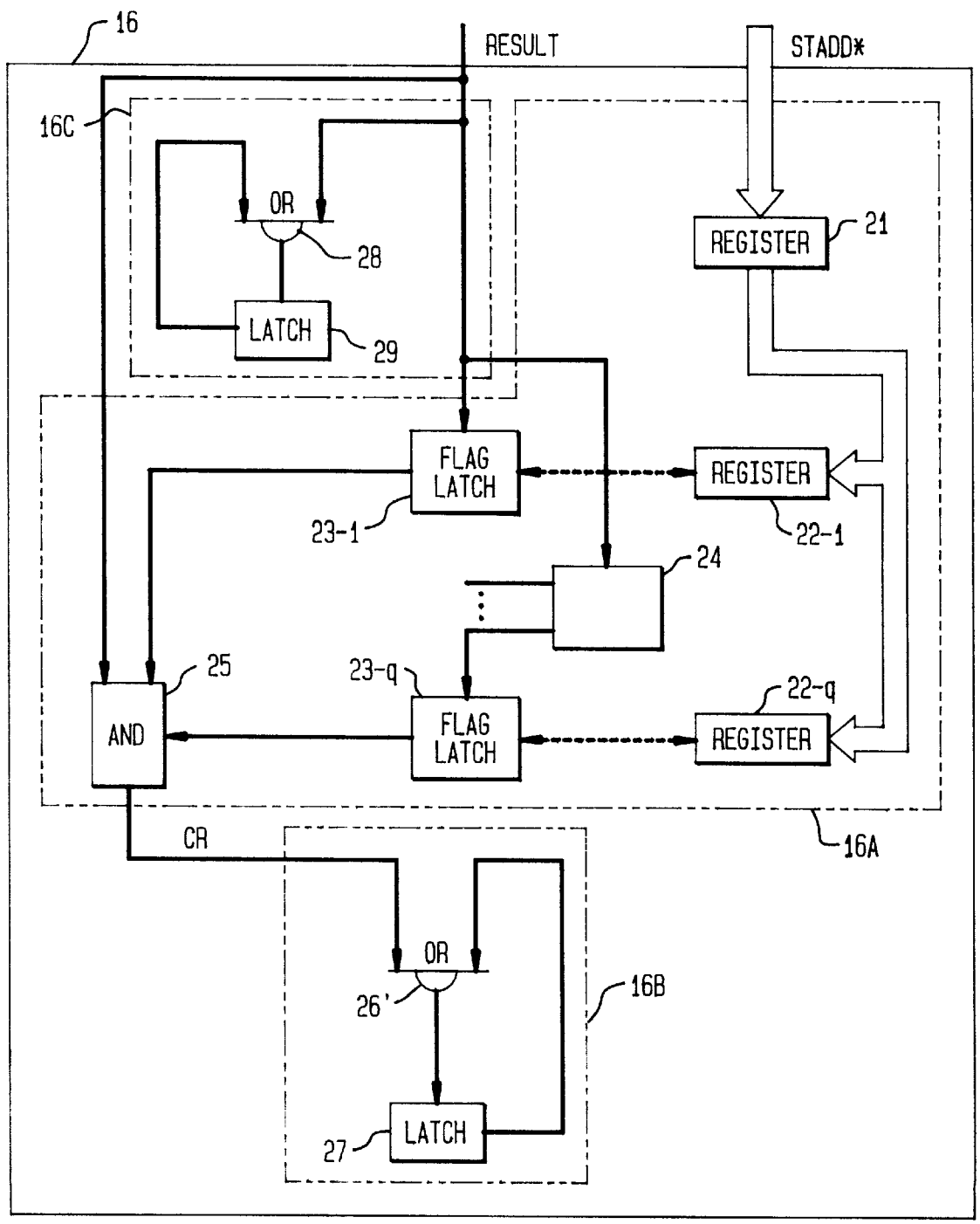
FIG. 2 shows schematic details of a conventional circuit implementation of the fail register unit 16 of FIG. 1 which allows only a one-pass fuse blow.
Figure 4:
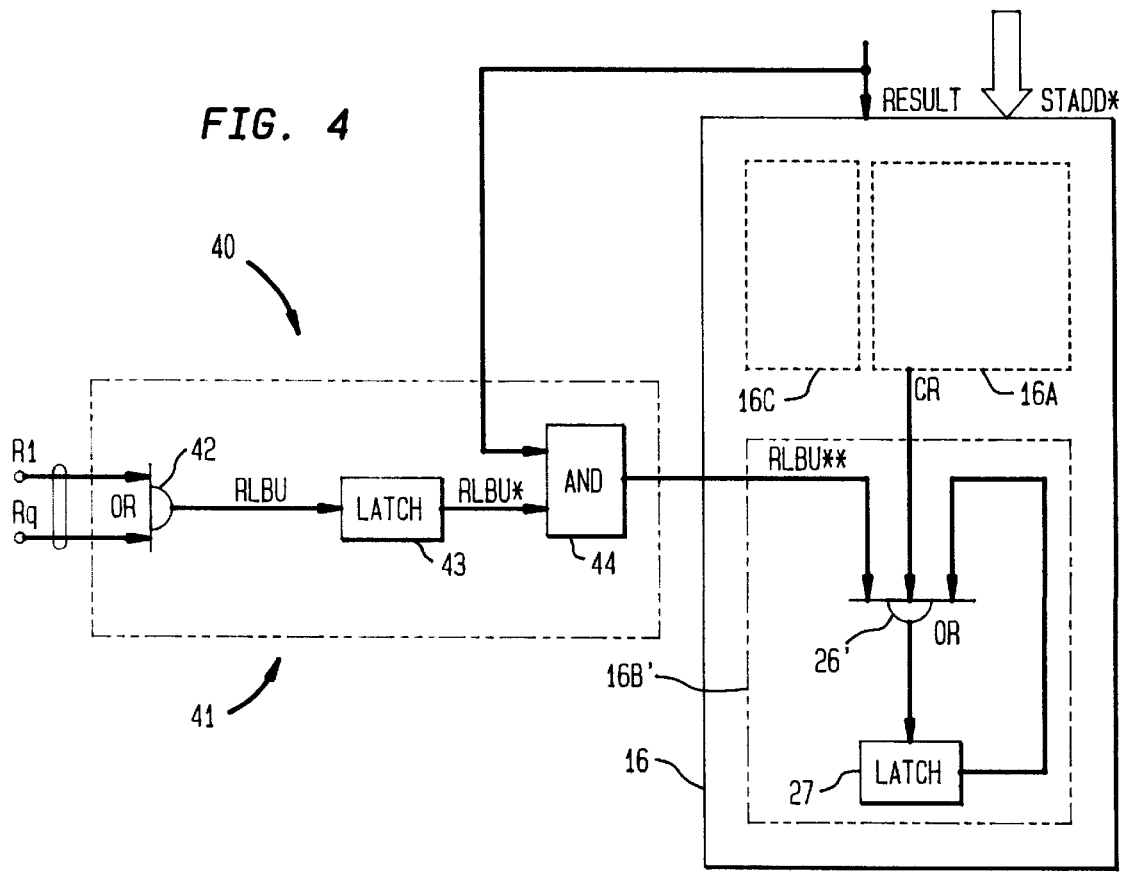
FIG. 4 illustrates a circuit which allows a two-pass fuse blow to the prior art SRAM macro of FIG. 1 and the modifications to be brought to the fail register unit 16 according to the present invention.

FIG. 4 is a schematic representation of the new implementation referenced 40, which essentially consists of the novel circuit referenced 41 and of unit 16, now labelled 16', after modification thereof. The difference between unit 16 and unit 16' resides in the block 16B' which is derived from block 16B of FIG. 2. Circuit 41 first comprises a q-way OR 42 whose inputs are connected in parallel to the lines carrying the R1 to Rq selection signals. The output signal is referred to as the Redundant Line Being Used (RLBU) signal. The latter is applied to a latch 43 to be stored therein. Latch 43 plays a key role in synchronizing the cycles between memory 12 and ABIST 11. In the 2-way AND gate 44, the RESULT signal is gated with the "delayed" RLBU signal (labelled RLBU*) outputted by latch 43, to generate, in turn, a signal labelled RLBU. In block 16B', the only change with respect to block 16B resides in the 2-way OR gate 26 which now becomes a 3-way OR gate referenced 26', whose additional input is connected to the output of AND gate 44, so that the signals that are applied to the 3-way OR gate 26' are the RLBU, the CR signal, and the output signal from the "not fixable" latch 27. Circuit 41 is therefore an independent circuit added to the architecture of the SRAM macro 10 shown in FIG. 1 which receives the RESULT signal and the R1-Rq selection signals. The RLBU** signal which is outputted therefrom may, alternatively, be used for other types of processing.

The RLBU signal is at "1" if at least one redundant word line is activated. In the case when the RESULT signal is at "0", i.e., no fail is detected and the RLBU* signal is at "1", thereby indicating that one redundant word line was used in a previous cycle. In this case, RLBU** remains at "0", the normal operating mode according to the redundancy mechanism. Alternatively, when RESULT and RLBU* are simultaneously set at "1", it signifies that one redundant word line was used and found defective. According to a significant feature of the present invention, regardless of the value of the CR signal, the "not fixable" latch 27 is immediately raised to "1". In this case, the product chip is determined bad and rejected. As apparent from FIG. 4, the RLBU signal is thus propagated through circuit 41 and combined with RESULT before being applied as an input to the 3-way OR gate 26' to override the content of the "not fixable" latch 27. Therefore, the "not fixable" latch 27 is not only set as described in U.S. Pat. No. 5,173,906, but it is also set as soon as a failure is discovered in a redundant word line in the ABIST mode.

Figure 5:
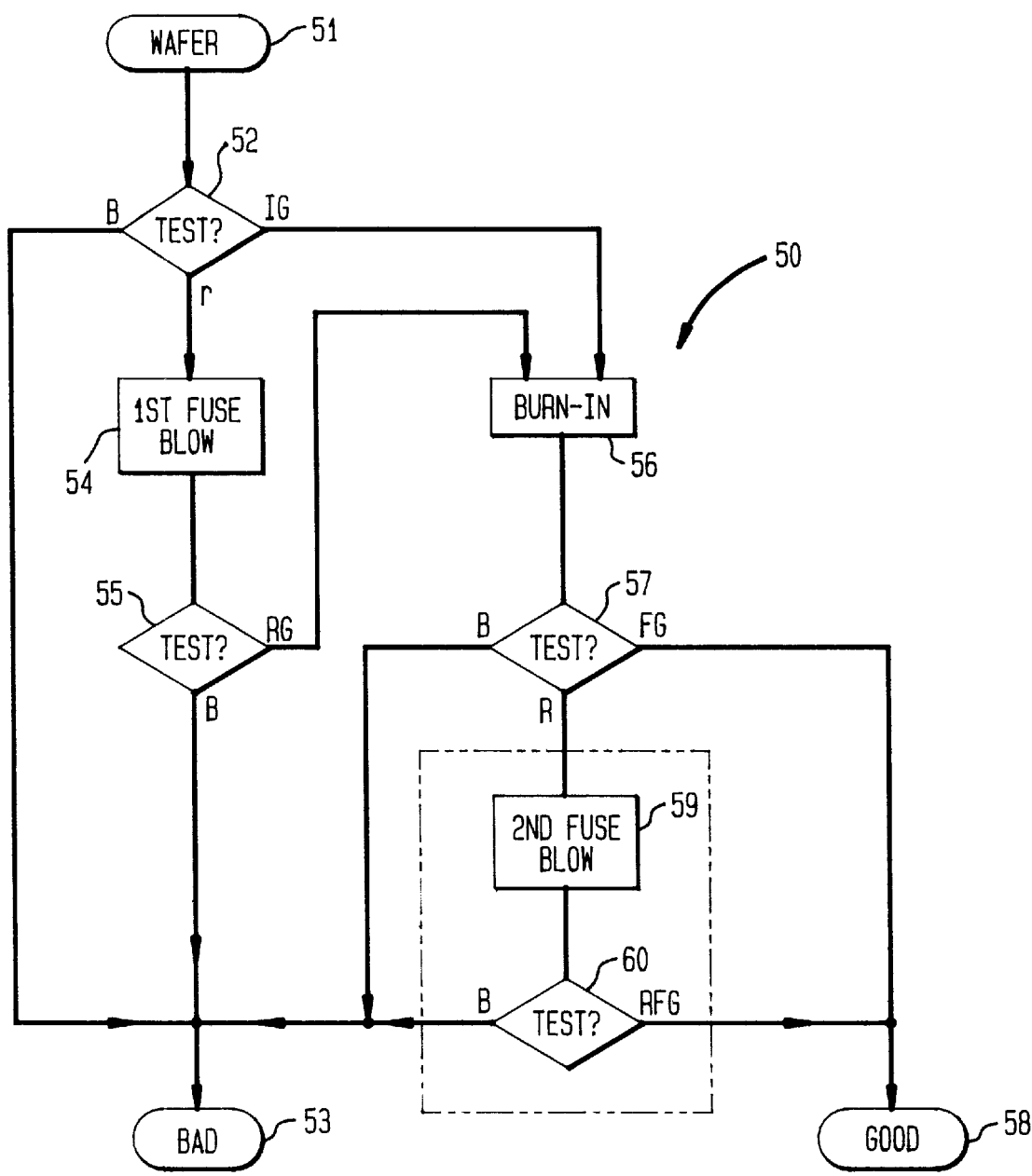
FIG. 5 illustrates the algorithm of the two-pass fuse blow methodology of the present invention that can be used in conjunction with the architecture shown in FIGS. 1 and 4.

In conjunction with the architecture of FIG. 4, the test methodology supporting a two-pass fuse blow is illustrated by algorithm 50 depicted in FIG. 5. Product chips at the wafer level stocked in block 51 are first tested in block 52, to identify initially good (IG), repairable (R), and bad (B) chips. Bad chips are rejected in block 53. Repairable chips are fixed in block 54 to allow the subsequent use of spare redundant word lines, as explained above in the description of FIG. 3. Once the defective word line addresses have been permanently stored in storage unit 19, the repaired chips are tested in block 55 to determine their functionality. Bad chips are rejected in block 53. Repaired good (RG) chips coming from block 55 and initially good (IG) chips coming from block 52 are submitted to burn-in in block 56 and tested in block 57. Depending on the results of the post burn-in test completed in block 57, finally good (FG) chips are retained for shipment in block 58, while bad chips are rejected from the production lots in block 53. According to the present invention, chips found to be repairable (R) after the post burn-in test 57, can now be repaired using a second pass fuse blow in block 59. Next, the final test is performed in box 60. Repaired finally good (RFG) chips are collected in box 58, while bad chips are rejected in block 53. As a result, the number of good chips tested and collected in block 58 show a significant increase with respect to the methodology of FIG. 3.

Figure 3:
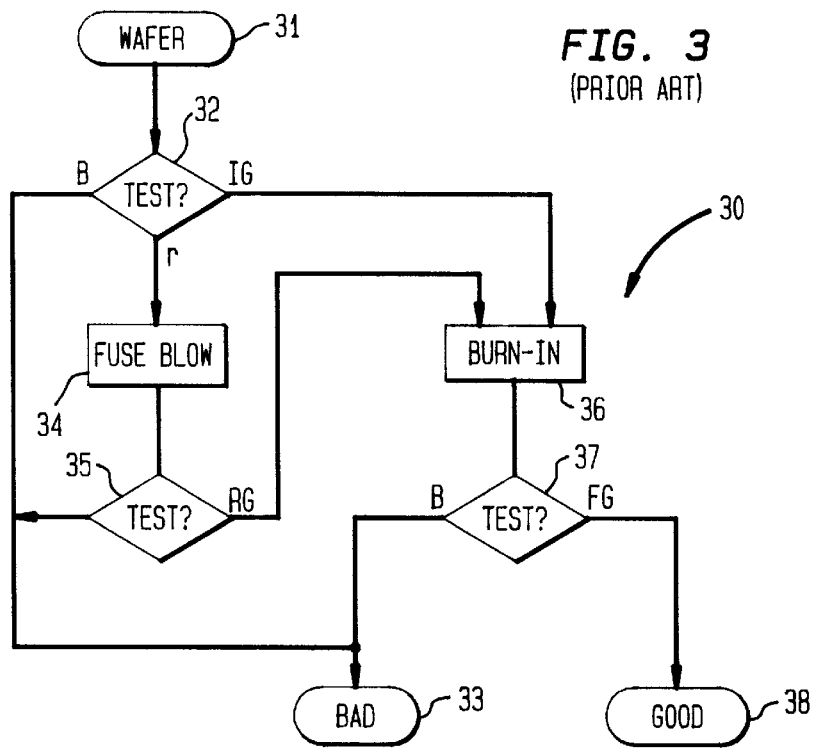
FIG. 3 illustrates the algorithm applicable to a standard one-pass fuse blow methodology used in conjunction with the architecture shown in FIGS. 1 and 2.

With the prior art methodology of FIG. 3, the content of the "not fixable" latch 27 is insufficient for correctly determining whether a product chip is fixable after performing the first fuse blow. On the contrary, according to the present invention, the content of latch 27 is now sufficient to fully exploit the redundancy mechanism.

For the purpose of simplicity, a two-pass fuse blow has been described, but a N-pass fuse blow could be envisioned as well. It could be therefore possible now to repair a memory unit that was already repaired many times, in either a system or a manufacturing environment. Such an N-pass fuse blow methodology would optimize the redundancy utilization and increase the system serviceability even more.

The present invention may be further improved. A "trace" mechanism can be incorporated indicating whether redundant word lines have been used to replace defective word lines. The suggested implementation consists in the inclusion of a dedicated latch per redundant word line, which, when set, indicates that the corresponding redundant word line has been used. This can be obtained by paralleling a latch on each "flag" line of the DADD bus. An advantageous way of implementation would be to use the already existing "flag" fuse mentioned above, and to store this information in a latch attached thereto. The use of the "trace" latches will allow ABIST 11 to use all existing redundant lines during a N-pass fuse blow methodology and to ensure a complete tracking of the redundant word lines utilization.

The advantages of the present invention are manifold. First, it provides a better exploitation of the redundancy mechanism and tracking in the SRAM macro 10. Secondly, it generates confidence that the product chips will work correctly. Thirdly, the benefits are immediately seen in the manufacturing yields. As soon as electrically blown fuses are introduced in future product chips, the benefits will immediately become apparent at the system level. These advantages are obtained at a low cost, in view of the small overhead required for the product chips, as demonstrated above in connection with the circuit 40 of FIG. 4. Although the present invention has been described by reference to redundant word lines, it is fully applicable to bit line or block redundancy as well.

The present invention may find wide application to the test of large memories of either the RAM (e.g. SRAMs, DRAMs, . . . ) or ROM (including flash memories) type.

Having thus described our invention, what we claim as new and desire to secure by letters patent is as follows:

We claim:

1. A circuit for allowing a two-pass fuse blow to an integrated circuit of a memory type comprising:

i.) memory means including:
   a standard array having a plurality of word lines,
   a redundant array provided with redundant word lines,
   a decoder means coupled to said standard array, and
   comparator means coupled to said redundant array and to said decoder means;

the circuit further comprising:

ii) ABIST means driving said memory means for providing said memory means with self-test patterns;

iii) data compression means responsive to said ABIST means and to said memory means for detecting and address of at least one of said word lines and said redundant word lines in said memory means that is defective; and iv) fail register means responsive to said ABIST means and to said data compression means for storing an address of a defective word line and for generating a number indicative of the number of defective word lines that exceeds the number of redundant word lines of said redundant array, v) said comparator means for comparing the addresses of said word lines and redundant word lines with the detected addresses of said defective word lines and for selecting a predetermined word line of said redundant array;

vi) OR-gate means having inputs for receiving signals generated by said comparator means and having an output connected to a latching means of said circuit; and vii) AND-gate means having a first input connected to said latching means and a second input responsive to signals generated by said data compression means, for generating a signal to said fail register means which is indicative of a defective line address of said redundant word lines.

2. The circuit as recited in claim 1, wherein the fail register means further comprises:

means for storing defective word line addresses and driving a "not fixable" latch connected to a 2-way OR-gate, a "fail/no fail" latch, said storing means and said "fail/no fail" latch being responsive to a first signal generated by said compression means that indicates a defective address in said memory means word line to be tested, said storing means being also responsive to signals generated by said ABIST means and generating a signal at an output thereat indicative of the number of defective word lines that exceeds the number of redundant word lines of said redundant array.

3. The circuit as recited in claim 2, wherein said AND-gate means is responsive to said first signal generated by said compression means.

4. The circuit as recited in claim 2, said 2-way or-gate further comprising a third input to from a 3-way OR-gate means driving said "not fixable" latch, wherein the output of said "not fixable" latch drives an input of said 3-way OR-gate, said storing means drives a second input of said 3-way OR-gate and said and gate means drives third input of said 3-way OR-gate.

5. The circuit as recited in claim 2, wherein said redundant word lines are each connected to a latch of said circuit, said latches providing a trace mechanism that indicates that a defective word line is replaced with one of said redundant word lines.

6. The circuit as recited in claim 1, wherein the integrated circuit of a memory type is a SRAM.

7. The circuit as recited in claim 1, wherein the integrated circuit of a memory type is a DRAM.

8. The circuit as recited in claim 1, wherein the integrated circuit of a memory type is a flash memory.

9. The circuit as recited in claim 1, wherein the integrated circuit of a memory type is a ROM.

* * * * *